US008222885B2

(12) United States Patent
Kirchmeier et al.

(10) Patent No.: US 8,222,885 B2
(45) Date of Patent: Jul. 17, 2012

(54) ISOLATING A CONTROL SIGNAL SOURCE IN A HIGH FREQUENCY POWER SUPPLY

(75) Inventors: Thomas Kirchmeier, Teningen (DE); Hans-Juergen Windisch, Ehrenkirchen (DE); Michael Glueck, Freiburg (DE); Erich Pivit, Allmersbach im Tal (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 537 days.

(21) Appl. No.: 12/177,818

(22) Filed: Jul. 22, 2008

(65) Prior Publication Data

US 2009/0027937 A1    Jan. 29, 2009

Related U.S. Application Data

(60) Provisional application No. 60/951,392, filed on Jul. 23, 2007.

(30) Foreign Application Priority Data

Apr. 3, 2008    (EP) ................... PCT/EP2008/002660

(51) Int. Cl.
*H02M 3/158*    (2006.01)
(52) U.S. Cl. ......... 323/350; 323/271; 323/282; 323/351
(58) Field of Classification Search .................. 323/271, 323/282, 350, 351
See application file for complete search history.

(56) References Cited

U.S. PATENT DOCUMENTS

| 3,820,008 A | 6/1974 | Guarnaschelli |
| 4,215,392 A | 7/1980 | Rhoads |
| 4,490,684 A | 12/1984 | Epsom et al. |
| 4,656,434 A | 4/1987 | Selin |
| 4,701,716 A | 10/1987 | Poole |
| 4,758,941 A | 7/1988 | Felton et al. |
| 4,860,189 A | 8/1989 | Hitchcock |
| 4,910,452 A | 3/1990 | Dickens et al. |
| 4,921,357 A | 5/1990 | Karube et al. |
| 4,980,810 A | 12/1990 | McClanahan et al. |
| 5,195,045 A | 3/1993 | Keane et al. |
| 5,222,246 A | 6/1993 | Wolkstein |

(Continued)

FOREIGN PATENT DOCUMENTS

EP    0073059    3/1983

(Continued)

OTHER PUBLICATIONS

De Vries et al., "Solid State Class DE RF Power Source", Proc. IEEE International Symposium on Industrial Electronics (ISIE'98), vol. 2, pp. 524-529, Pretoria, South Africa, Jul. 1988.

(Continued)

*Primary Examiner* — Jeffrey Sterrett
(74) *Attorney, Agent, or Firm* — Fish & Richardson P.C.

(57) ABSTRACT

A high frequency power supply, in particular a plasma supply device, for generating an output power greater than 1 kW at a basic frequency of at least 3 MHz with at least one switch bridge, which has two series connected switching elements, wherein one of the switching elements is connected to a reference potential varying in operation, and is activated by a driver, and wherein the driver has a differential input with two signal inputs and is connected to the reference potential varying in operation.

15 Claims, 4 Drawing Sheets

U.S. PATENT DOCUMENTS

| | | | |
|---|---|---|---|
| 5,225,687 A * | 7/1993 | Jason | 250/551 |
| 5,363,020 A | 11/1994 | Chen et al. | |
| 5,382,344 A | 1/1995 | Hosokawa et al. | |
| 5,394,061 A | 2/1995 | Fujii | |
| 5,424,691 A | 6/1995 | Sadinsky | |
| 5,434,527 A | 7/1995 | Antone | |
| 5,435,881 A | 7/1995 | Ogle | |
| 5,438,498 A | 8/1995 | Ingemi | |
| 5,563,775 A | 10/1996 | Kammiller | |
| 5,574,410 A | 11/1996 | Collins et al. | |
| 5,610,452 A | 3/1997 | Shimer et al. | |
| 5,810,963 A | 9/1998 | Tomioka | |
| 5,875,103 A | 2/1999 | Bhagwat et al. | |
| 5,944,942 A | 8/1999 | Ogle | |
| 6,084,787 A | 7/2000 | Nyberg | |
| 6,229,718 B1 | 5/2001 | Nilssen | |
| 6,246,599 B1 | 6/2001 | Jang et al. | |
| 6,297,696 B1 | 10/2001 | Abdollahian et al. | |
| 6,344,768 B1 | 2/2002 | Daun-Lindberg et al. | |
| 6,365,868 B1 | 4/2002 | Borowy et al. | |
| 6,703,080 B2 | 3/2004 | Reyzelman et al. | |
| 6,704,203 B2 | 3/2004 | Chapuis et al. | |
| 6,760,234 B2 | 7/2004 | Yuzurihara et al. | |
| 6,791,851 B2 | 9/2004 | Brkovic | |
| 6,909,617 B1 | 6/2005 | Mirskiy | |
| 6,992,902 B2 | 1/2006 | Jang et al. | |
| 6,996,892 B1 | 2/2006 | Dening et al. | |
| 7,138,861 B2 | 11/2006 | Sundstrom et al. | |
| 7,161,818 B2 | 1/2007 | Kirchmeier et al. | |
| 7,244,343 B2 | 7/2007 | Watanabe et al. | |
| 7,259,623 B2 | 8/2007 | Coleman | |
| 7,312,584 B2 | 12/2007 | Tamita et al. | |
| 7,333,348 B2 | 2/2008 | Horiuchi et al. | |
| 7,353,771 B2 | 4/2008 | Millner et al. | |
| 7,403,400 B2 | 7/2008 | Stanley | |
| 7,452,443 B2 | 11/2008 | Glueck et al. | |
| 7,755,300 B2 | 7/2010 | Kishinevsky et al. | |
| 7,796,005 B2 | 9/2010 | Blankenship et al. | |
| 7,872,523 B2 | 1/2011 | Sivakumar et al. | |
| 7,884,590 B2 * | 2/2011 | Liu | 323/282 |
| 2003/0215373 A1 | 11/2003 | Reyzelman et al. | |
| 2004/0031566 A1 | 2/2004 | Takahashi et al. | |
| 2004/0105288 A1 | 6/2004 | Watanabe et al. | |
| 2004/0114399 A1 | 6/2004 | Lincoln et al. | |
| 2005/0088231 A1 | 4/2005 | Ziegler | |
| 2005/0122087 A1 * | 6/2005 | Sakai et al. | 323/271 |
| 2005/0255809 A1 | 11/2005 | Glueck | |
| 2006/0158911 A1 | 7/2006 | Lincoln | |
| 2006/0191880 A1 | 8/2006 | Kwon | |
| 2006/0196426 A1 | 9/2006 | Gluck | |
| 2006/0252283 A1 | 11/2006 | Takeda et al. | |
| 2007/0121267 A1 | 5/2007 | Kotani et al. | |
| 2007/0145900 A1 | 6/2007 | Kirchmeier et al. | |
| 2009/0153127 A1 * | 6/2009 | Chen | 323/350 |

FOREIGN PATENT DOCUMENTS

| | | |
|---|---|---|
| EP | 1 272 014 | 1/2003 |
| EP | 1783904 | 10/2005 |
| EP | 1 701 376 | 9/2006 |
| EP | 1701376 | 9/2006 |
| EP | 1 783 904 | 5/2007 |
| JP | 55082967 | 6/1980 |
| WO | 9749267 | 12/1997 |
| WO | 9857406 | 12/1998 |
| WO | 2005094138 | 6/2005 |

OTHER PUBLICATIONS

Walker et al., "An Isolated MOSFET Gate Driver". Australasian Universities Power Engineering Conference, AUPEC'96, 1996, vol. 1, Melbourne, pp. 175-180.

International Search Report from corresponding PCT Application No. PCT/EP2008/002660, mailed Sep. 8, 2008, 11 pages.

* cited by examiner

ISOLATING A CONTROL SIGNAL SOURCE IN A HIGH FREQUENCY POWER SUPPLY

CROSS REFERENCE TO RELATED APPLICATIONS

This application claims priority under 35 U.S.C. §119(e) to U.S. Patent No. 60/951,392, filed on Jul. 23, 2007 and under 35 U.S.C. §119(a) to PCT/EP2008/002660, filed on Apr. 3, 2008. Both of these priority applications are hereby incorporated by reference in their entirety.

TECHNICAL FIELD

The invention relates to a plasma supply device for generating an output power greater than about 500 W at an essentially constant basic frequency greater than about 3 MHz for a plasma process.

BACKGROUND

A plasma supply device is a plasma power supply that supplies plasma processes with electrical power. The plasma supply device operates at a basic frequency that, when used as a plasma power supply, should only deviate slightly from a theoretical value. Typical basic frequencies are, for example, 3.39 MHz, 13.56 MHz, 27 MHz, 40 MHz and 62 MHz. An inverter, which has at least one switching element, generates from a DC signal of a DC power supply an alternating signal that changes its sign or its amplitude periodically at the rate of the basic frequency. For this purpose, the switching elements are switched backwards and forwards between a conducting and a non-conducting state at the rate of the basic frequency. An output network generates from the alternating signal generated by the inverter a sinusoidal output signal at essentially the predetermined basic frequency.

A plasma is a special aggregate condition that is produced from a gas. Every gas consists in principle of atoms and/or molecules. In the case of a plasma, the gas is largely ionized, which means that the atoms and/or molecules are split into positive and negative charge carriers, i.e., into ions and electrons, due to the supply of energy. A plasma is suitable for machining workpieces because the electrically charged particles are chemically highly reactive and can also be influenced by electric fields. The charged particles can be accelerated by means of an electric field on a workpiece, where they can release individual atoms from the workpiece upon collision with the workpiece. The released atoms can be removed by gas flow (etching) or coated on other workpieces (production of thin films). A plasma can be used to machine extremely thin layers, for example, in the region of few atom layers. Typical applications for plasma machining are semiconductor technology (coating, etching, etc.), flat screens (similar to semiconductor technology), solar cells (similar to semiconductor technology), architectural glass coating (heat protection, dazzling protection, etc.), storage media (CD, DVD, hard discs), decorative coatings (colored glasses, etc.) and tool hardening. These applications impose high demands in terms of accuracy and process stability.

Furthermore, a plasma can also be used to excite lasers, particularly gas lasers.

To generate a plasma from a gas, energy is supplied to the gas. Energy can be supplied in different ways, for example, as light, heat, or electrical energy. Moreover, a plasma can be ignited with the electrical energy. A plasma for machining workpieces is typically ignited in a plasma chamber, for which purpose an inert gas, e.g., argon, is generally conducted into the plasma chamber at low pressure. The gas is exposed to an electric field that is produced by electrodes and/or antennae.

A plasma is generated or is ignited when several conditions are met. A small number of free charge carriers must be present, and in most cases use is made of the free electrons that are always present to a small extent. The free charge carriers are accelerated so much by the electrical field that they create additional free electrons when colliding with atoms or molecules of the inert gas, thus producing positively charged ions and additional free electrons. The additional charge carriers are again accelerated and on collision produce additional ions and electrons. An avalanche effect is created. The natural recombination counteracts the constant generation of ions and electrons, i.e., electrons are attracted by ions and recombine to form electrically neutral atoms and/or molecules. Therefore energy is constantly supplied to an ignited plasma in order to maintain the plasma.

SUMMARY

In one aspect, a high frequency power supply for generating an output power greater than 1 kW at a basic frequency of at least 3 MHz includes at least one switch bridge with two series connected switching elements, and a first of the switching elements connected to a reference potential varying in operation, and a driver controlling the first of the switching elements, wherein the driver includes a differential input with two signal inputs and is connected to the reference potential varying in operation.

In another aspect, a method for operating a high frequency power supply, for generating an output power greater than 1 kW at a basic frequency of at least 3 MHz, wherein the output power is generated by means of at least one switch bridge, which has two series connected switching elements, wherein the reference potential of one of the switching elements is varied in operation, includes controlling the switching element with a driver, which has a differential input with two signal inputs, by applying a differential signal to the differential input.

Some embodiments ensure reliable activation of one or a plurality of switching elements of the bridge branch even in the case of high frequency voltage variation with a large voltage deviation.

In another aspect of a high frequency power supply, the driver has a differential input with two signal inputs and is connected to a reference potential that varies in operation, i.e. it lies on this potential. The driver input, which is connected to the control voltage and has the two signal inputs, is uncoupled in this manner from earth or a DC power supply so that it is able to follow the instantaneous voltage at the center of the bridge branch on which the reference potential lies. Thus, the driver and the switching element (the HI-MOSFET) are on floating potential, The connection of the driver to the reference potential can be made directly by a cable as short as possible, or indirectly, e.g. by an inserted resistor.

Implementations can include one or more of the following features. For example, the control voltage applied to the driver input can be a very small signal compared to the voltage amplitude at the center of the bridge branch. Thus, when switching the switch of the bridge branch, the voltage at the bridge branch center varies substantially so that the control voltage of the driver can be disturbed, particularly at the time of switching. This can result in undesirable behavior of the switches and consequently, if both switches close at the same time, to their destruction.

As the two switching elements of the half bridge can be directly connected to positive and negative poles of a DC supply, a galvanic isolation of the control voltages and of any auxiliary voltage supplies of the drivers, which may be required, can be advantageous.

The galvanic isolation of the control voltage can be achieved, for example, by an optocoupler or by a signal transformer.

Optocouplers can have the disadvantage of low speed, which may not be sufficient for higher AC frequencies. Moreover, the output circuit of an optocoupler is highly susceptible to faults due to a reaction from components connected on the secondary side, so that optocouplers are used in circuits with low frequency and low voltage deviation.

Signal transformers can transmit the control voltage and at the same time, can galvanically isolate an oscillator of the control voltage source and the driver. The control voltage source can be connected by the signal transformer to a driver circuit having the driver. However, signal transformers have a not inconsiderable coupling capacitance between the primary and secondary winding (also known as parasitic capacitance (s), stray capacitances (of the signal transformer)). This parasitic capacitance enables an alternating current to flow between the driver lying at center level (that is, a reference potential) and the at least AC grounded control voltage source.

The transformer being only a signal transformer, which only has to transmit control powers, e.g., in the region of 1 W, can in principle be of a small dimension. Nevertheless the transformer should have a certain minimum coupling or minimum transmission power to activate the connected driver sufficiently steeply.

The above-mentioned undesirable current gives rise to an undesirable AC voltage between the driver input and the center of the bridge branch.

The undesirable AC voltage appears in the common mode because of the symmetry of the signal transformer at both secondary connections (output connections of the signal transformer on the secondary side winding); the differential voltage between the two connections continues to be the desired control voltage.

A differential input of the driver (with two signal lines) is favorable for the suppression of undesirable AC voltages. Some embodiments achieve a delay-free, precise activation of at least one switching element. In some embodiments, such activation can also be achieved at high frequency and at a high voltage deviation of the output signal of the switch bridge.

Despite the use of a differential input, an undesirable AC voltage can be disturbing because it can displace the voltages at both signal inputs from the input voltage range of the driver. To prevent this, at least one of the two signal lines leading to the driver input can be connected either directly or by an impedance (e.g. resistor and/or capacitor) to the common reference point of the driver and of the assigned switching element.

An ohmic, e.g., low resistance, coupling of one of the signal inputs of the driver can be made to a reference potential. However, one of the signal inputs of the driver can also be coupled with a capacitor to the reference signal. The close ohmic or capacitive coupling of one of the signal lines at the driver input to the reference potential of the driver, and hence to the center of the bridge branch, can keep the levels of the differential driver input within a certain voltage range. The coupling can also be based on an internal wiring of the driver, one signal input of which can be connected directly or at low resistance to the reference potential of the driver.

Based on the low resistance coupling, an undesirable alternating current can flow from the signal line via the parasitic capacitance(s) of the signal transformer to the control voltage source. However, this means that the input circuit of the driver is no longer symmetrical, so that the interfering voltage is no longer synchronous at the differential driver input, but that there is an undesirable voltage difference. The driver circuit can therefore have an input network that generates a symmetrical differential input signal for the driver.

The signal lines can be connected at low resistance between the signal transformer and the driver input. In particular, the connection can include an impedance with $|Z|<|$parasitic capacitance of the signal transformer$|$, or a resistor with such an impedance can connect the two signal lines to each other. For example, both signal inputs of the driver can be terminated at low resistance. In particular, the signal inputs can be connected by a resistor. Thereby, the action of the currents, which flow via the coupling capacitance of the signal transformer and which influence the signal shape of the driver input signal, can be kept as low as possible.

The signal inputs (or the signal lines assigned to the signal inputs) can be connected at low resistance to the reference potential that varies in operation. In particular, the connection can include an impedance with $|Z|<|$coupling capacitance of the signal transformer$|$, or a resistor with such a resistance can connect the signal lines or the assigned signal inputs to the reference potential. Then, the undesirable alternating current divides into two halves, thereby providing both signal lines with the same undesirable AC voltage. The driver input is then free from the undesirable voltage difference. The signal inputs can similarly be connected to the reference potential, e.g., by an impedances with similar or the same values. Symmetrical connections to the reference potential can help to counteract the undesirable voltage difference.

In general, the lower the termination resistance the smaller will be the undesirable voltage difference.

The output of the signal transformer, in particular, at least one of its connections, can be connected by means of a low resistance connection to the reference potential. To the reference potential leads a further connection that is connected to a signal input of the driver. When MOSFET transistors are switched over in half or full bridge circuits, their internal capacitances must be transferred. The respective driver current can generate in turn a current on the earth cable of the driver. A real cable will never be an absolute short-circuit, but will have a certain impedance related to the cable length and diameter. The impedance can not only be an ohmic resistance but also, in particular, an inductance, which is formed, for example, by bond wires in an IC.

The current flowing on the earth cable can cause an undesirable voltage drop at the impedance. The potential of the driver earth therefore varies relative to the center of the switch bridge. Because of the (internal) coupling of a signal input to the driver earth, the undesirable voltage drop can affect the signal voltage of the associated signal line that is measured relative to the center. The signal voltage on the other signal line then remains unchanged. The associated voltage difference can be counteracted by connecting the outputs of the signal transformer to the signal inputs of the driver by a common mode coke. The common mode choke can then be used at the signal inputs of the driver where the undesirable voltage difference is present.

The interfering currents flowing through one or both windings of the common mode choke can cause magnetic fluxes, which are mutually amplifying and give rise to an impedance. The differential wanted signals can also flow through the two windings. However, the respective magnetic fluxes cancel each other so that no impedance is generated for these signals. The common mode choke may also induce a voltage, which is present at one of the signal inputs of the driver by an undesirable current flow through only one of the two signal lines to the other signal input of the driver.

Common mode interfering signals can be suppressed in this manner without at the same time weakening the differential wanted signals.

The low resistance connection of the output of the signal transformer to the reference potential can be provided between the signal transformer and the common mode choke, thereby reinforcing the influence of the common mode choke.

The common mode choke can be a coaxial cable that is surrounded by an element increasing a magnetic field or that encloses the element increasing a magnetic field. Such a common mode choke can easily be manufactured. The element increasing the magnetic field, normally a ferrite, amplifies the magnetic field, thereby further improving the mode of action of the common mode choke.

The signal transformer itself can have a low coupling capacitance that can be achieved by small dimensions.

The signal transformer can have only one single turn in a primary winding and one single turn in a secondary winding. By reducing the number of turns of the primary and secondary windings, the coupling capacitance between the turns of the signal transformer is reduced and hence also the undesirable alternating current.

The signal transformer can include an element increasing a magnetic field, in which case each turn of the primary and secondary windings is guided through or beside the element increasing the magnetic field. Because of the high permeability of the element increasing the magnetic field, the number of turns can be reduced and hence the coupling capacitance.

Guiding the turns of the primary and secondary windings through, around or beside the element increasing the magnetic field can be carried out in such a manner that the two primary side connections terminate on one side of the element and the secondary side connections terminate on the opposite side of the element.

In such configurations, the cables can be kept very short, thereby further reducing the coupling capacitance. Moreover, the primary side cables can be guided close to each other, giving rise to only a low stray inductance, and the secondary side cables can be guided close to each other also giving rise to only a low stray inductance.

In another aspect, a method is disclosed for operating a high frequency power supply, in particular a plasma supply device, for generating an output power >1 kW at a basic frequency >3 MHz, where the output power is generated by at least one switch bridge having two series connected elements, and where the reference potential of one of the switching elements is varied in operation and the switching element is activated by a driver. Two signal lines with differential content are connected to a differential input with two signal inputs of the driver. This means that the wanted signal is provided as a potential difference between the two signal lines. Ideally the sum of the two potentials is constant on the two signal lines at all times. Such a signal transmission and such input and output circuits are also called "balanced" or symmetrical. If an interference occurs, both signal lines are superimposed uniformly by the interfering signal. As symmetrical signals are transmitted as input signals preferably to a driver designed as a differential amplifier, the interference signals are reduced to zero in the differential amplifier because they are in-phase and are mutually amplified when forming the difference of the signals. Symmetrical signals can be generated from asymmetrical signals by a signal transformer. For example, the asymmetrical signal can be fed into a central tapping of a transformer and the symmetrical signals are determined at both winding ends.

To ensure reliable activation of the switching element of the switch bridge even at high frequency and with a high voltage deviation, a symmetrical output of a signal transformer can be connected to the symmetrical input of the driver.

At least one of the signal inputs or at least one signal line assigned to a signal input can be connected to the reference potential, particularly by means of an impedance. This signal input is then provided with little or no voltage.

A low interference activation of the upper switching element of the half bridge can be achieved if an input signal is provided to the symmetrical signal inputs of the driver, wherein the input signal includes a differential wanted signal without opposite phase interference voltages and with as few in-phase interference voltages as possible.

The two signal inputs and/or the output of the signal transformer, which transmits a control voltage to the driver, can be terminated at low resistance.

Furthermore, interferences of the differential input signal can be suppressed using a common mode choke for inducing an interference potential at a second signal input of the driver, which interference potential can be generated by an undesirable alternating current at the first signal input of the driver.

The coupling capacitance of the primary winding and of the secondary winding of a signal transformer can be minimized by using one turn for each primary winding and/or secondary winding of the signal transformer. The windings may be arranged in the region of an element increasing the magnetic field. Then fewer turns can be used.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference symbols in the various drawings indicate like elements.

DETAILED DESCRIPTION

Figure 1:
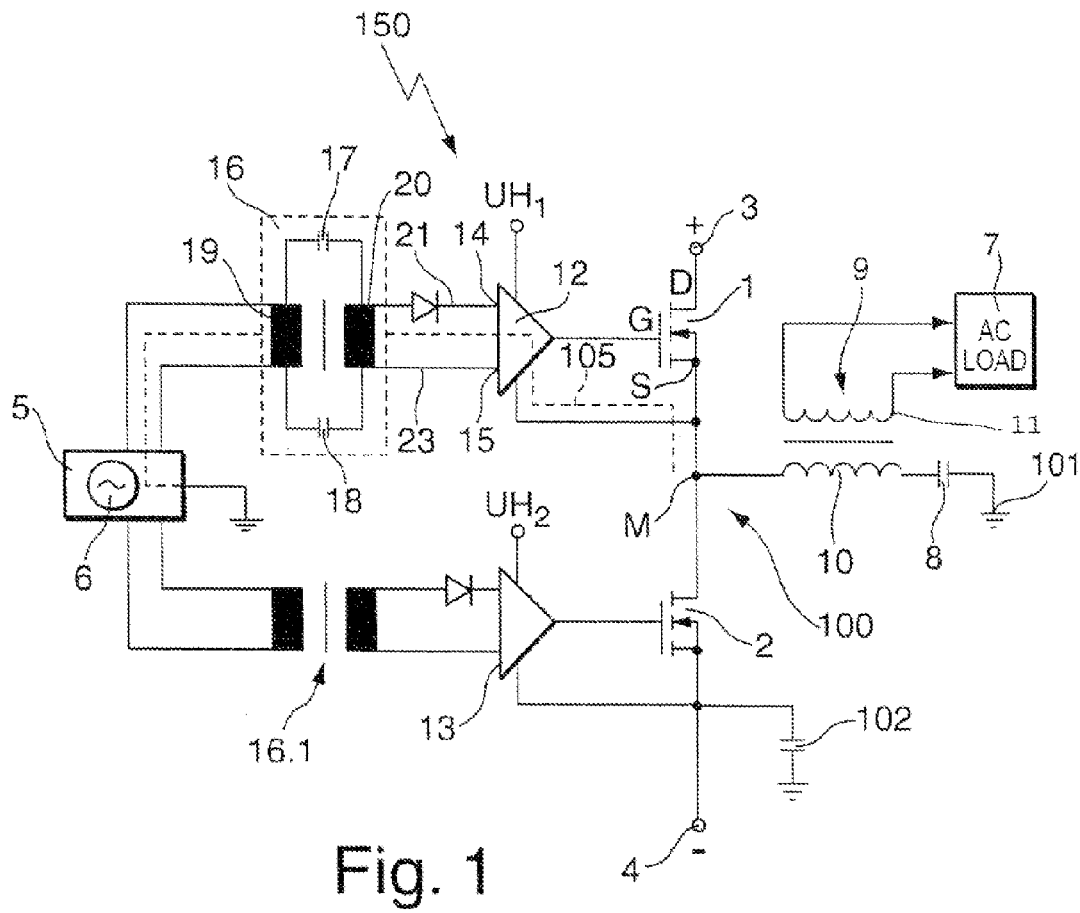
FIG. 1 is a circuit diagram of a high frequency power supply in a half bridge with a complete switch bridge.

A radio frequency (RF) signal that ignites and maintains a plasma process, for example, a high frequency signal, is generated with a switch bridge that has at least two switching elements. Switch bridges or bridge branches are used in half bridge or full bride circuits in various applications of power electronics, e.g., switch-mode power supplies, current supplies or amplifiers. Such circuits are also known as class D amplifiers.

The at least two switching elements of a switch bridge can be, e.g., metal oxide semiconductor field-effect transistors (MOSFETs), which are connected in series; the connection point of the switching elements represents the center of the switch bridge. The center of this bridge branch is connected by the two switching elements (also referred to in the following as switch elements or switches) alternately to the positive or negative pole of a direct current power supply. The alternating control of the two switching elements and of additional switching elements of a second bridge branch is provided by a control voltage source that can include an oscillator, which determines the frequency of the output signal, and additional components such as inverters, phase shifters and signal formers.

In a half bridge circuit an alternating current load is switched between the center and earth. A capacitor connected in series to the alternating current load frees the alternating current from a possible DC voltage portion so that the earth may be either the negative or positive pole of the DC supply or another point, which is connected to at least one of these poles as far as alternating current is concerned.

A full bridge circuit consists of two such bridge branches (half bridges) whose centers are connected at the desired frequency, each in opposite directions, to the positive and negative pole of the DC voltage supply. The alternating current load is arranged between these two centers. An additional capacitor for releasing the output signal from a DC voltage portion is not necessary.

Switching elements can be made of semiconductor components. In the described embodiments, exemplary semiconductor components can include, for example, bipolar power transistors, MOSFETs, IGBTs and thyristors, although mainly the use of MOSFETs is described.

MOSFETs can be capable to switch higher currents with less power loss. The MOSFETs control the drain-source section as a function of the gate-source voltage, i.e., the source connection is the electrical reference potential of the component.

Based on different dopings, there are two types of MOSFETs, the P-channel MOSFET and the N-channel MOSFET. Based on its low resistance properties in the conducting condition, an N-channel MOSFET can be considered more suitable for high power bridge circuits than a P-channel MOSFET, which tolerates less current and has a higher power loss.

However, the use of two N-channel MOSFETs in a bridge branch can give rise to the problem that the MOSFET, which switches the positive pole of the DC supply to the center (HI-MOSFET), has its source connection to the center of the bridge branch. Therefore, its reference point is switched backwards and forwards with the amplitude of the center voltage. In contrast to this, the MOSFET, which switches the negative pole of the DC supply to the center (LO-MOSFET), has its reference point on the negative pole of the DC supply and is therefore without alternating component.

The rapidly varying reference potential of the HI-MOSFET can affect the activation.

FIG. 1 shows a half bridge circuit 150 with a switch bridge 100 and corresponding activation circuit of a high frequency power supply. A center M of the switch bridge 100 can be switched by two switching elements 1 and 2 alternately to a positive pole 3 or a negative pole 4 of a DC supply. The alternating activation of the two switching elements 1 and 2 is achieved by the activation circuit that includes a control voltage source 5 with an oscillator 6, which determines the frequency of the output signal. The center M represents the output of the switch bridge 100.

In the half bridge circuit 150, an alternating current load 7 is connected to a secondary winding 11 of a power transformer 9. A primary winding 10 of the power transformer 9 is connected to the center M.

A series connected capacitor 8 frees the alternating current from a possible DC voltage portion so that earth can be connected either to the negative pole 4 or the positive pole 3 of the DC supply. The poles 3 and 4 of the DC supply are AC connected to earth by capacitors (only capacitor 102 for the pole 4 is shown).

Semiconductor components can be used as switching elements 1 and 2, and, in particular, the use of MOSFET transistors is described below. The drain-source section of MOSFET transistors 1 and 2 is controlled as a function of the gate-source voltage. In particular, a source connection S is the electrical reference point of the semiconductor component. Drivers 12 and 13 activate the MOSFET transistors 1 and 2, respectively, and therefore have the electrical reference point of the source connection S.

Since the two MOSFET transistors 1 and 2 are directly connected with the positive pole 3 and the negative pole 4 of the DC supply, respectively, galvanic isolations of the control voltages and driver supply voltages UH1 and UH2 of the drivers 12 and 13 are provided. The driver supply voltages UH1 and UH2 are provided by driver power supplies not shown. The other pole of the driver power supply, which supplies UH1, is connected to the center M, and the other pole of the driver power supply, which supplies UH2, is connected to the negative pole 4 of the DC supply.

The switch bridge 100 comprises the two N-channel MOSFET transistors 1 and 2 as switching elements. The MOSFET transistor 1 (top switch, high side switch, HI-MOSFET) switches the positive pole 3 of the DC supply to the center M and is connected with its source connection S to the center M of the switch bridge 100, and its reference point is therefore switched backwards and forwards with the amplitude of the voltage at the center M. The MOSFET transistor 2 (bottom switch, low side switch, LO-MOSFET) switches the negative pole 4 of the DC supply to the center M and is connected to the negative pole of the DC supply and is therefore without an alternating component. Because of the constantly negative reference point of MOSFET transistor 2, the driver 13 is connected in series to a signal transformer 16.1 supplying a differential signal. The signal transformer 16.1 provides galvanic isolation between the control voltage from the control voltage source 5 and the driver 13.

For the MOSFET transistor 1, signal inputs 14 and 15 of the driver 12 for the control voltage are effectively uncoupled from earth 101 or the DC supply to ensure that the control voltage follows the instantaneous voltage at center M of the switch bridge 100. The driver 12 and the transistor 1 are said to be "floating." The control voltage is a very small signal (low signal deviation) compared to the amplitude at the center M. When the MOSFET transistors 1 and 2 of the switch bridge 100 are switched over, the voltage at the center M varies considerably so that at that moment in time the control voltage of the driver 12 may be disturbed, which can result in undesirable behavior of the MOSFET transistor 1 and in case the two MOSFET transistors 1 and 2 close simultaneously, can result in their destruction.

A galvanic isolation of the control voltage through a signal transformer 16 can prevent this or reduce the chances of it happening. The signal transformer 16 transmits the control voltage and at the same time isolates galvanically the control voltage source 5 from the driver 12. However, the signal transformer 16 has not inconsiderable coupling capacitance 17 and 18 between its primary winding 19 and its secondary winding 20, which enables an alternating current to flow between the driver 12 connected to the reference potential at the center M and the at least AC grounded control voltage source 5. The path of that alternating current is indicated by a dotted line 105. This undesirable alternating current may give rise to undesirable AC voltage at the signal inputs 14 and 15.

Because of the symmetry of the signal transformer 16, the undesirable AC voltage appears at both connections of the secondary winding 20 in a common mode. The differential voltage (which equals the potential difference) at the two connections of the secondary winding 20 stays to be the desired control voltage, e.g., the control or wanted signal. Nevertheless, an undesirable AC voltage is interfering because each of the two voltages at both signal inputs 14 and 15, which form a differential input of the driver 12, may shift out of the input voltage range of the driver 12. One can prevent this by connecting one of the signal lines (FIG. 2) or both signal lines 21 and 23 (FIGS. 3 and 4) or the signal inputs 14 and 15 to the common reference point of the driver 12 and the MOSFET transistor 1, i.e., the center M. The connection can be direct or can include an impedance (for example, a resistor 24, 18, 50, and/or a capacitor 25).

Figure 2:
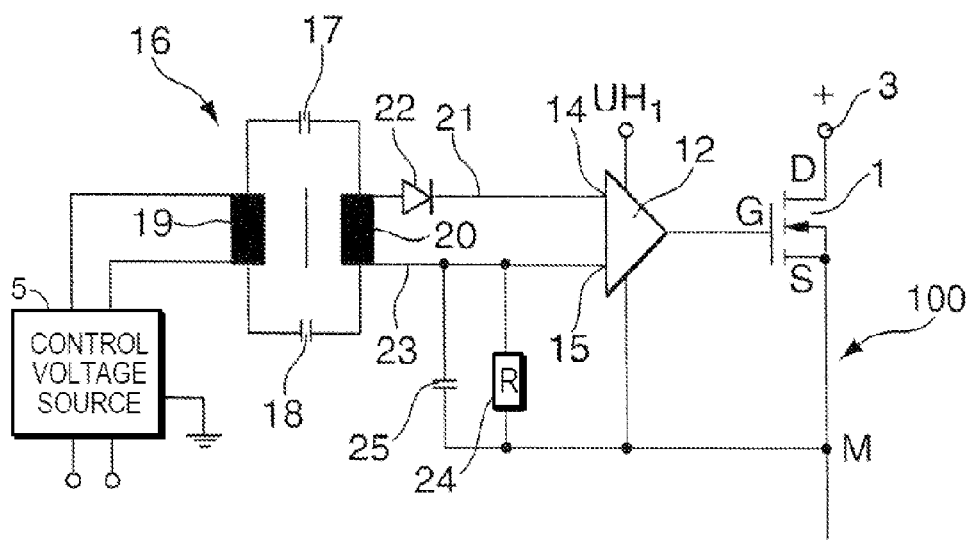
FIG. 2 is a circuit diagram of a high frequency power supply with a signal line connected to a reference potential.

If only one of the signal lines 21 and 23 is connected to the reference potential at the center M, as shown in FIG. 2, the input circuit of the driver 12 is no longer symmetrical, so that the interfering voltage is no longer applied to the signal inputs 14 and 15 in the common mode and that instead an undesirable voltage difference is applied.

In the following FIGS. 2-8 only the upper half of the switch bridge 100 is shown as the undesirable voltage difference acts only on the driver 12 of the MOSFET transistor 1.

In FIG. 2, the signal transformer 16 is connected by the first connection of the secondary winding 20 via the first signal line 21 and a rectifier 22 to the single input 14 of the driver 12, whose control output leads to a gate G of the MOSFET transistor 1. A drain D of the MOSFET transistor 1 is connected to the positive pole 3 of the DC supply, while the source S, as already described, is connected to the center M of the switch bridge 100. The second connection of the secondary winding 20 of the signal transformer 16 is connected via a second signal line 23 to the second signal input 15 of the driver 12. The signal input 15 is connected via a resistor 24 to the center M and hence is connected to the reference potential that varies in operation. A capacitor 25 is provided as a parallel circuit to the resistor 24. The signal input 15 of the driver 12 therefore lies on a potential that is similar to the potential of the center M of the switch bridge 100, and is therefore subject to the same variations as the center M. The resistor 24 and the capacitor 25 form an impedance.

Instead of the resistor 24, an internal resistor 50 (FIG. 3) of the driver 12 can be provided that connects signal input 15 to the center M. The resistor 24 and the resistor 50 render the input circuit of the driver 12 asymmetrical.

Figure 3:
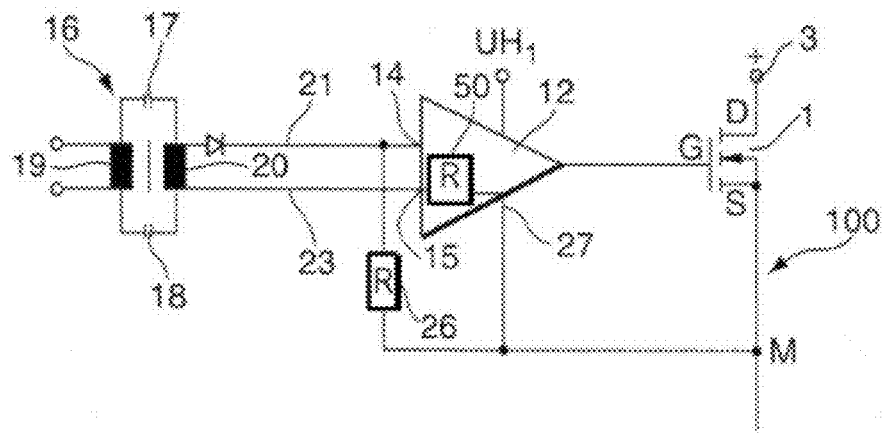
FIG. 3 is a circuit diagram of a high frequency power supply with two signal lines connected to a reference potential, in which a signal line is connected by an internal resistor of the driver to the reference potential.

In FIG. 3, a low resistance resistor 26 connects the signal line 21 of the driver 12, and hence its signal input 14, to the center M of the switch bridge 100. This provides a similar coupling of the signal line 21 to the center M, serving as the reference point, which is also connected to a power ground connection 27 (earth connection) of the driver 12. Thus, the input circuit of the driver 12 is balanced.

The resistors 26 and 50 form an input network for the driver 12 that preserves the symmetry of the input signal. The input network and the driver 12 form a driver circuit.

Figure 4:
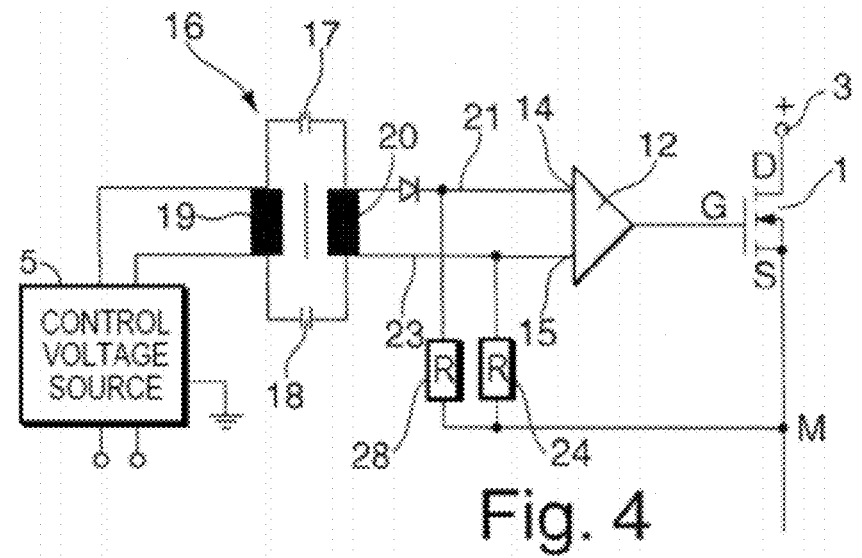
FIG. 4 is a circuit diagram of a high frequency power supply with two signal lines connected externally to a reference potential.

FIG. 4 shows a low resistance connection of the signal lines 21 and 23 of the driver 12 to the reference potential of the driver 12. In this case, the signal line 21 of the driver 12 is connected via a resistor 28, and the signal line 23 is connected via the resistor 24 to the reference potential at the center M, where the resistors 24 and 28 are of a similar or the same size. The signal lines 21 and 23 are on a similar potential, and cannot leave the input voltage range of the driver 12. In this configuration, the undesirable alternating current is divided into two halves, thereby loading the signal lines 21 and 23 with the same undesirable AC voltage. The driver input is now essentially free from the undesirable voltage difference.

Figure 5:
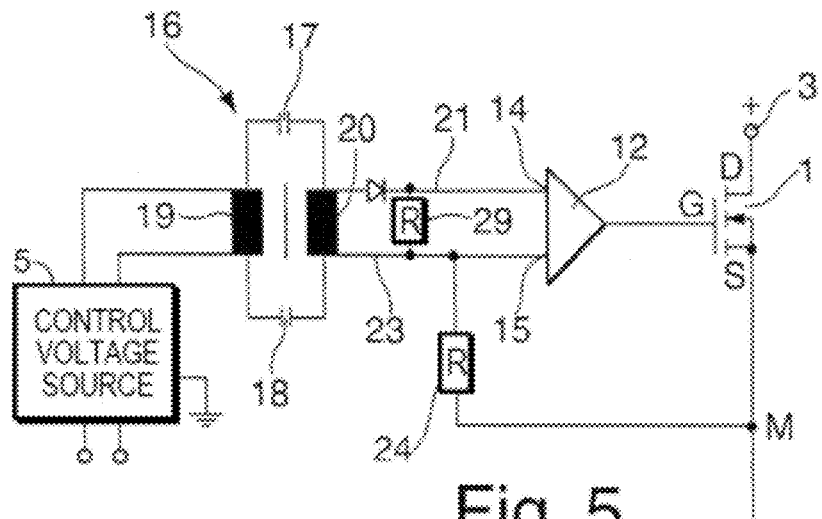
FIG. 5 is a circuit diagram of a high frequency power supply with signal lines terminated at low resistance.

The configuration of FIG. 5 achieves a comparable effect. A resistor 29 connects the signal line 21 and 23 of the driver 12 so that signal lines 21 and 23 are (low resistance) terminated by the resistor 29. The second signal line 23 is connected via resistor 24 to the center M, which means that the output of the signal transformer 16 is terminated at low resistance. The lower the termination resistance 29, the smaller is the undesirable voltage difference.

The resistors 24 and 29 also form an input network for the driver 12, which generates balanced differential input signals for the driver 12.

Figure 6:
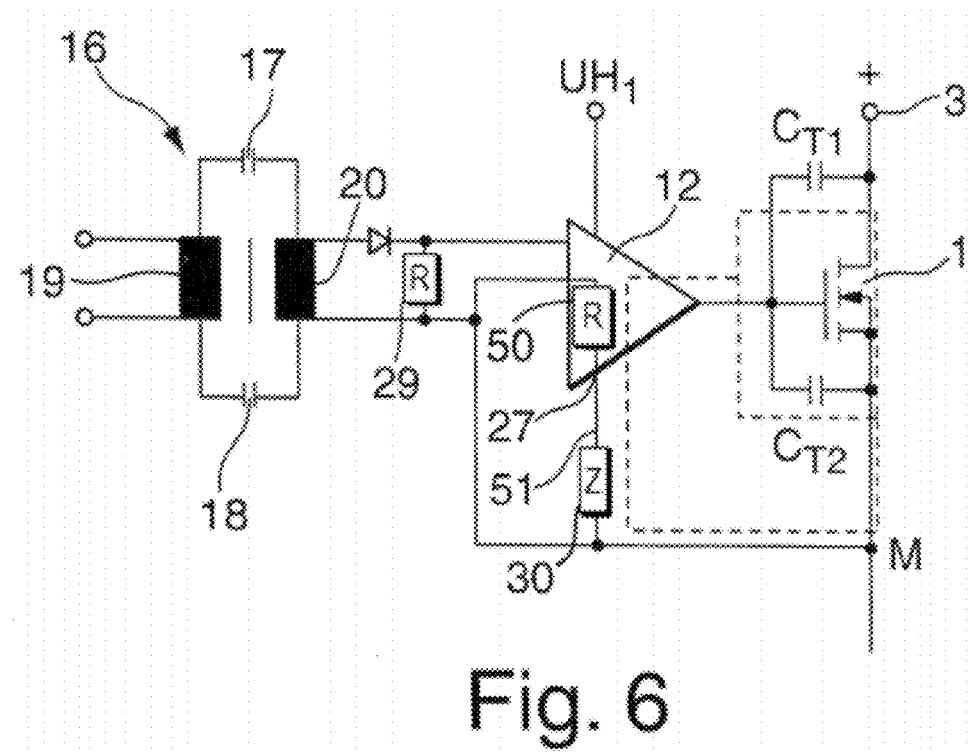
FIG. 6 is a circuit diagram of a high frequency power supply with a signal transformer terminated at low resistance.

When switching MOSFET transistor 1, its internal parasitic, e.g., undesirable, capacitances CT1 and CT2 (FIG. 6) are recharged. The path of the charging current for the internal capacitances CT1 and CT2 is shown in FIG. 6 as dotted lines. The driver current generates a current on connecting line 51 of the driver 12 to the reference point M. The connecting line 51 has an impedance 30 between a power ground connection 27 of the driver 12 and the mass potential of the driver 12. The current flowing via connecting line 51 gives rise to a voltage drop at the impedance 30, thereby varying the potential of the driver earth (at the power ground connection 27) relative to the center M of the switch bridge 100. This generates additional interfering voltages at the input, and also differential voltages, but those voltages are reduced by a resistor 29.

The resistors 29 and 50 also form an input network for the driver 12. The driver 12 and the input network form a driver circuit.

Figure 7:
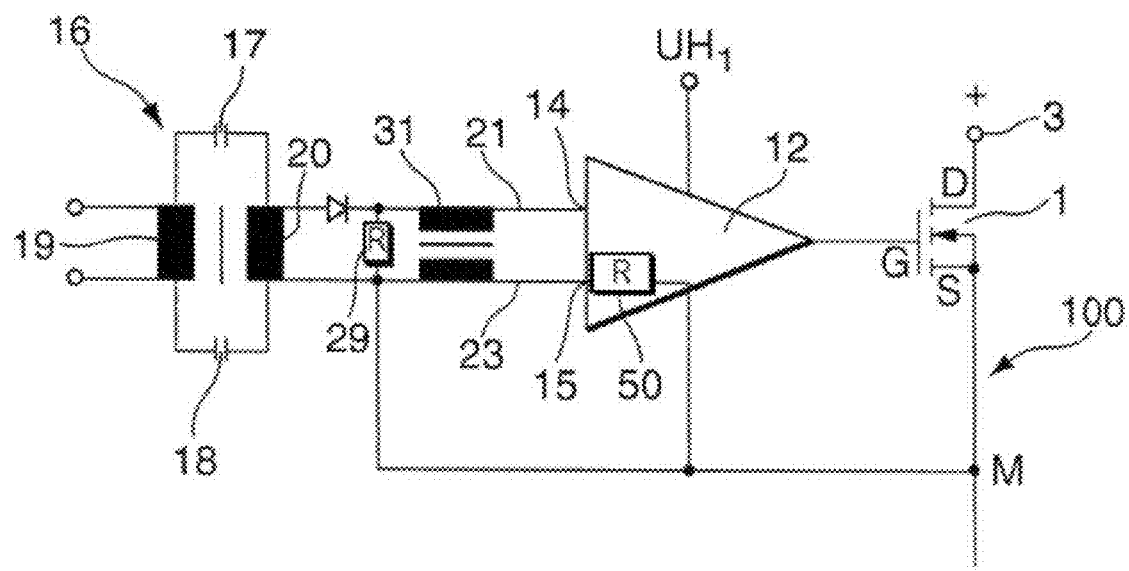
FIG. 7 is a circuit diagram of a high frequency power supply with a common mode choke.

FIG. 7 shows a common mode choke 31 that is arranged directly at the signal inputs 14 and 15 of the driver 12. The common mode choke 31 prevents undesirable current flow through the signal transformer 16 to the control voltage source 5. Moreover, a voltage is inducted on the signal line 21 by a unilateral current flow on a signal line 23, so that in the case of high resistance termination of the signal line 21 no undesirable voltage difference occurs.

The common mode choke 31 has two inputs and two outputs. Between a first of those outputs and a first of those inputs, the common mode choke 31 has an inductance with a first high impedance for the frequency to be attenuated. Between a second of those outputs and a second of those inputs the common mode choke 31 has a second inductance, which normally is of the same value as the first inductance. For opposite phase currents through the two inductances caused by a voltage difference, the magnetic fields of the two currents cancel each other. The common mode choke 31 therefore represents a low impedance. For in-phase currents through the two inductances, the magnetic fields of the currents are added together and the common mode choke 31 represents a very high impedance. As the signal inputs 14 and 15 of the driver 12 are uniformly increased by the voltage jumps at the switching element 1, the common mode choke 31 can limit the common mode currents because, for example, the termination resistor 29 of the signal transformer 16 is positioned before the common mode choke 31, and the signal line 23 of the driver 12 has a high resistance.

The common mode choke 31 and the resistor 50 represent another embodiment of an input network.

Figure 8:
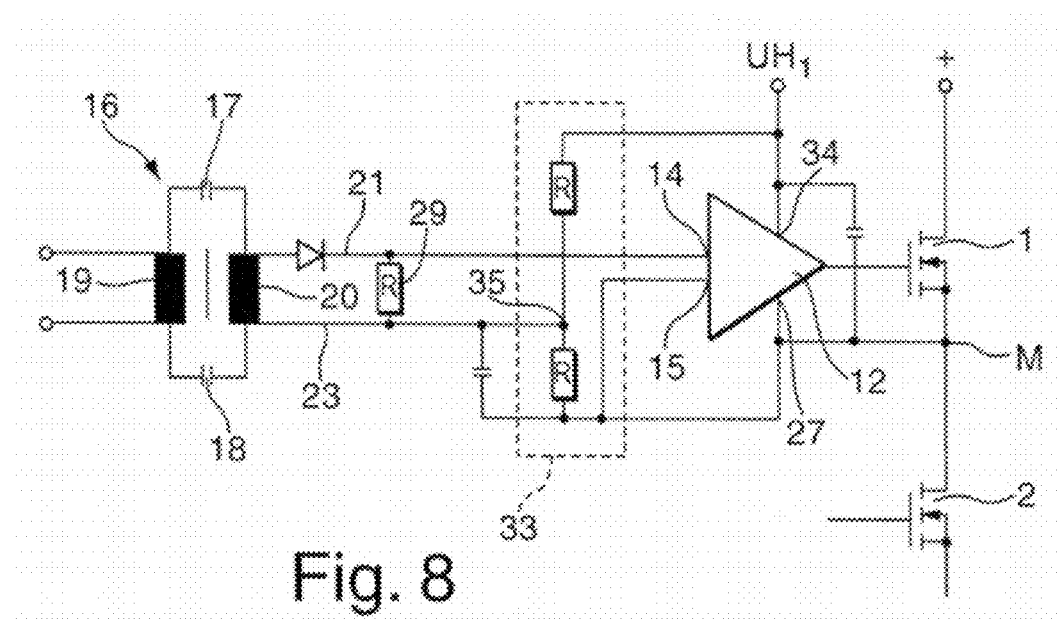
FIG. 8 is a circuit diagram of a high frequency power supply with a voltage supply of a driver.

FIG. 8 shows a voltage divider 33 that is connected between voltage connections 27 and 34 of the driver 12. The voltage divider 33 brings the secondary winding of the signal transformer 16 to a certain DC voltage level so that the signal input 14 is also on this level. The second connection of the secondary winding 20 of the signal transformer 16 is connected to a central tap 35 of the voltage divider 33, and the signal input 15 of the driver 12 is connected to the center M via resistors. The signal input 15 remains at the driver earth whilst the signal input 14 is provided with a pre-voltage. The activating signal, e.g. the differential input signal, is superimposed on those potentials at the signal inputs 14 and 15. The lower connection of the secondary winding 20 is AC grounded by the lower resistor of the voltage divider 33 and by the capacitor parallel to the lower resistor.

The undesirable alternating current over the coupling capacitances 17 and 18 can be reduced by reducing the capacitance of the coupling capacitances 17 and 18 of the signal transformer 16.

Figure 9:
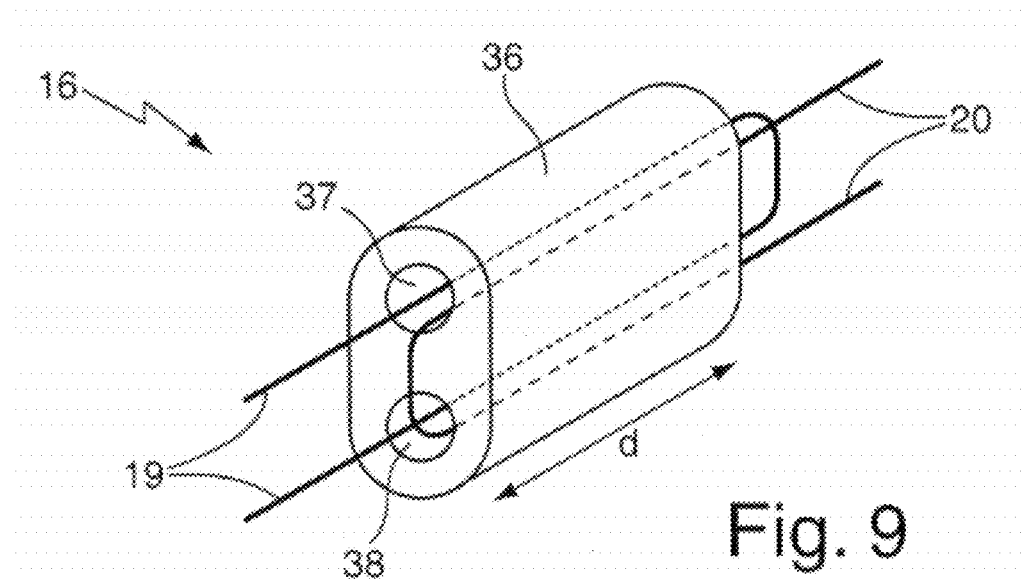
FIG. 9 is a perspective view of a signal transformer.

FIG. 9 shows an embodiment of the signal transformer 16 that has only one turn in the primary winding 19 and only one turn in the secondary winding 20. These primary and secondary side turns 19 and 20 are fed through a double-hole ferrite core 36. Specifically, the primary and secondary side turns 19 and 20 run through the double hole ferrite core 36 once forward and once back in such a manner that the two primary side connections terminate on one side of double hole ferrite core 36 and the secondary side connections terminate on the opposite side of double hole ferrite core 36. The forward and back running cable of the primary side turn 19 runs in two different bores 37 and 38 of the double hole ferrite core 36. The forward and back running line of the secondary side turn 20 also runs in the bores 37 and 38. Thus, the primary and secondary side lines use bores 37 and 38 together in order to achieve a good magnetic coupling.

The double hole ferrite core 36 has a dimension d of less than 8 mm. The coupling capacitance that can be achieved with this configuration is 1 pF. In the above described embodiments, such short small ferrite components can be used for the transmission of such powers (in the range of, e.g., 100 mW to 2 W) even though they may be considered to be configured too small for the power to be transmitted. Nevertheless, one can avoid overloading of the components and distortions when transmitting the signals as it can be done with ferrite cores larger than 10 mm. The distortion by such a transformer can be reduced with respect to the distortion that results from a higher coupling capacitance.

A number of embodiments of the invention have been described. Nevertheless, it will be understood that various modifications may be made without departing from the spirit and scope of the invention. Accordingly, other embodiments are within the scope of the following claims.

What is claimed is:

1. A high frequency power supply for generating an output power greater than 1 kW at a basic frequency of at least 3 MHz, the power supply comprising:
    at least one switch bridge including two series connected switching elements, and a first of the switching elements connected to a reference potential varying in operation;
    a driver circuit including:
        a driver configured to control the first of the switching elements, wherein the driver includes a differential input with two signal inputs and is connected to the reference potential, and wherein at least one of the two signal inputs is coupled to the reference potential via ohmic coupling; and
        a signal transformer comprising a primary and a secondary winding and having a parasitic capacitance, wherein a magnitude of a resistance associated with the ohmic coupling is less than a magnitude of the parasitic capacitance; and
    a control voltage source, the control voltage source connected via the signal transformer to the driver.

2. The high frequency power supply of claim 1, wherein the two signal inputs are both connected at low resistance to the reference potential.

3. The high frequency power supply of claim 1, wherein the driver circuit further includes an input network for the driver, and the input network is configured to generate a symmetrical differential input signal for the driver.

4. The high frequency power supply of claim 1, further comprising signal lines assigned to the signal inputs and terminated at low resistance between the signal transformer and the driver.

5. The high frequency power supply of claim 1, wherein outputs of the signal transformer are connected via a common mode choke to the signal inputs of the driver.

6. The high frequency power supply of claim 5, wherein a low resistance connection of the signal lines assigned to the signal inputs is provided upstream from the common mode choke.

7. The high frequency power supply of claim 1, wherein the signal transformer is configured to have a low coupling capacitance.

8. The high frequency power supply of claim 1, wherein the signal transformer has only one turn in a primary winding and one turn in a secondary winding.

9. The high frequency power supply of claim 8, wherein the signal transformer includes an element increasing the magnetic field, wherein the turn of the primary winding and the turn of the secondary winding are guided through, around or beside the element.

10. The high frequency power supply of claim 9, wherein the turn of the primary and the turn of the secondary winding are guided through, around or beside the element in such a manner that the two primary side connections of the primary and secondary windings terminate on one side of the element and the secondary side connections of the primary and secondary windings terminate on the opposite side of the element.

11. A method for operating a high frequency power supply, for generating an output power greater than 1 kW at a basic frequency of at least 3 MHz, the method comprising:
    generating an output power by means of at least one switch bridge that has at least two series connected switching elements including varying a reference potential of one of the switching elements in operation;
    controlling the switching element with a driver that has a differential input with two signal inputs, by applying a differential signal to the differential input; and
    transmitting a control voltage from a signal transformer comprising a primary and secondary winding to the driver, the signal transformer having a parasitic capacitance;
    wherein at least one of the two signal inputs is coupled to the reference potential via ohmic coupling and wherein a magnitude of a resistance associated with the ohmic coupling is less than a magnitude of the parasitic capacitance.

12. The method of claim 11, further comprising providing at least one of the signal inputs with the reference potential.

13. The method of claim 11, further comprising terminating with a low resistance the two signal inputs and/or the output of the signal transformer.

14. The method of claim 11, further comprising, at a second signal input of the driver, inducing an interfering potential by a common mode choke, wherein the interfering potential is similar to an interfering potential generated by an undesirable alternating current at a first signal input of the driver.

15. The method of claim 11, further comprising using at least one of a single turn for at least one of the primary winding and the secondary winding of the signal transformer and a configuration of the windings in the region of an element increasing the magnetic field to provide a reduced capacitive coupling of a primary winding and of a secondary winding of a signal transformer.

* * * * *